United States Patent
Yang et al.

(10) Patent No.: US 12,141,404 B2
(45) Date of Patent: *Nov. 12, 2024

(54) DISPLAY DEVICE AND METHOD OF INSPECTING THE SAME

(71) Applicant: SAMSUNG DISPLAY CO., LTD., Yongin-si (KR)

(72) Inventors: Sung-Jin Yang, Cheonan-si (KR); Hyunsik Park, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 15 days.

This patent is subject to a terminal disclaimer.

(21) Appl. No.: 18/062,008

(22) Filed: Dec. 5, 2022

(65) Prior Publication Data
US 2023/0105876 A1    Apr. 6, 2023

Related U.S. Application Data

(63) Continuation of application No. 17/148,289, filed on Jan. 13, 2021, now Pat. No. 11,520,444.

(30) Foreign Application Priority Data

Apr. 21, 2020   (KR) ........................ 10-2020-0048323

(51) Int. Cl.
 *G06F 3/044*    (2006.01)
(52) U.S. Cl.
 CPC .......... *G06F 3/0443* (2019.05); *G06F 3/0446* (2019.05); *G06F 2203/04111* (2013.01)

(58) Field of Classification Search
 CPC .... G06F 3/0443; G06F 3/0445; G06F 3/0446; G06F 2203/04111
 See application file for complete search history.

(56) References Cited

U.S. PATENT DOCUMENTS

| | | | | |
|---|---|---|---|---|
| 5,825,196 A | * | 10/1998 | Irie | G09G 3/006 345/92 |
| 6,218,847 B1 | * | 4/2001 | Matsushita | G01B 7/06 324/699 |
| 7,839,479 B2 | * | 11/2010 | Choi | H10K 50/844 349/149 |
| 8,432,506 B2 | * | 4/2013 | Qian | G02F 1/1345 349/54 |

(Continued)

FOREIGN PATENT DOCUMENTS

| | | |
|---|---|---|
| JP | 2016-194748 A | 11/2016 |
| KR | 10-1082293 B1 | 11/2011 |

(Continued)

OTHER PUBLICATIONS

European Search Report dated Sep. 17, 2021, Application No. 21169023.5, 11 Sheets.

*Primary Examiner* — Amy Onyekaba
(74) *Attorney, Agent, or Firm* — Lewis Roca Rothgerber Christie LLP

(57) ABSTRACT

A display device includes a display panel and an input sensor on the display panel, the input sensor including sensing electrodes, signal lines connected to the sensing electrodes, an insulating layer on the signal lines, and inspection lines on the insulating layer and electrically connected to each other, each of the inspection lines respectively overlapping a corresponding one of the signal lines.

19 Claims, 16 Drawing Sheets

(56) References Cited

U.S. PATENT DOCUMENTS

| | | | | |
|---|---|---|---|---|
| 8,975,905 | B2* | 3/2015 | Kim | G09G 3/006 |
| | | | | 324/754.01 |
| 8,981,378 | B2* | 3/2015 | Kim | H01L 27/124 |
| | | | | 257/32 |
| 9,182,866 | B2 | 11/2015 | Inagaki et al. | |
| 9,191,663 | B2* | 11/2015 | Kwak | H04N 17/004 |
| 9,285,890 | B2* | 3/2016 | Park | H02H 9/046 |
| 9,547,207 | B2* | 1/2017 | Moh | G02F 1/13452 |
| 9,638,949 | B1* | 5/2017 | Kim | G06F 3/04164 |
| 9,720,449 | B2* | 8/2017 | Ko | G06F 3/0443 |
| 9,747,825 | B2* | 8/2017 | Kim | H10K 71/70 |
| 9,798,412 | B2* | 10/2017 | Hong | G06F 3/041 |
| 9,891,735 | B2* | 2/2018 | Bae | G06F 3/0443 |
| 9,933,886 | B2* | 4/2018 | Kim | G06F 3/0446 |
| 10,331,264 | B2* | 6/2019 | Shin | G06F 3/044 |
| 10,453,910 | B2* | 10/2019 | Oh | H10K 59/131 |
| 10,522,608 | B2 | 12/2019 | Park et al. | |
| 10,706,753 | B2* | 7/2020 | Lee | G02F 1/136213 |
| 10,732,746 | B2 | 8/2020 | Kim et al. | |
| 10,840,312 | B2 | 11/2020 | Lee et al. | |
| 11,016,604 | B2* | 5/2021 | Takada | G06F 3/0418 |
| 11,107,869 | B2* | 8/2021 | Lee | H01L 27/0288 |
| 2004/0119917 | A1* | 6/2004 | Lim | G02F 1/133512 |
| | | | | 349/110 |
| 2005/0263810 | A1* | 12/2005 | Iizuka | H01L 27/0203 |
| | | | | 257/E27.111 |
| 2006/0103412 | A1* | 5/2006 | Kimura | G09G 3/006 |
| | | | | 73/865.8 |
| 2006/0109394 | A1* | 5/2006 | Miyagawa | H05K 3/361 |
| | | | | 349/149 |
| 2007/0120790 | A1* | 5/2007 | Jeon | G09G 3/006 |
| | | | | 345/87 |
| 2008/0179593 | A1* | 7/2008 | Lim | H01L 27/12 |
| | | | | 257/E27.111 |
| 2011/0057893 | A1 | 3/2011 | Kim et al. | |
| 2013/0134986 | A1* | 5/2013 | Yun | G09G 3/006 |
| | | | | 324/543 |
| 2013/0221493 | A1* | 8/2013 | Kim | H01L 21/6835 |
| | | | | 257/774 |
| 2013/0321010 | A1* | 12/2013 | Cooley | G06F 3/0446 |
| | | | | 324/543 |
| 2014/0027720 | A1* | 1/2014 | Kim | H10K 59/88 |
| | | | | 257/E51.001 |
| 2014/0160072 | A1* | 6/2014 | Inagaki | G06F 3/0443 |
| | | | | 345/174 |
| 2014/0191930 | A1* | 7/2014 | Okumoto | G09G 3/006 |
| | | | | 345/55 |
| 2014/0247403 | A1* | 9/2014 | Mun | H10K 59/40 |
| | | | | 349/12 |
| 2014/0319528 | A1* | 10/2014 | Kesho | H10K 59/131 |
| | | | | 257/59 |
| 2015/0241718 | A1* | 8/2015 | Jeong | G02F 1/1309 |
| | | | | 445/2 |
| 2015/0325159 | A1* | 11/2015 | Li | G09G 3/006 |
| | | | | 438/151 |
| 2015/0332644 | A1* | 11/2015 | Fujikawa | G09G 3/3611 |
| | | | | 345/100 |
| 2015/0346869 | A1* | 12/2015 | Jang | G06F 3/04184 |
| | | | | 345/174 |
| 2016/0172385 | A1* | 6/2016 | Noumi | H01L 27/124 |
| | | | | 257/72 |
| 2016/0189644 | A1* | 6/2016 | So | G09G 3/3233 |
| | | | | 345/103 |
| 2016/0217755 | A1* | 7/2016 | Pan | G09G 3/3648 |
| 2016/0284771 | A1* | 9/2016 | Hwang | H10K 59/1213 |
| 2016/0307921 | A1* | 10/2016 | Chang | G02F 1/16766 |
| 2016/0315284 | A1* | 10/2016 | Jeon | H10K 50/8445 |
| 2016/0372062 | A1* | 12/2016 | Nakayama | G02F 1/133 |
| 2016/0379907 | A1* | 12/2016 | Ko | G09G 3/3233 |
| | | | | 257/48 |
| 2017/0060341 | A1* | 3/2017 | Jeon | G09G 3/3648 |
| 2017/0083137 | A1* | 3/2017 | Kurasawa | G06F 3/04164 |
| 2017/0139503 | A1* | 5/2017 | Yoshiki | H05K 1/0274 |
| 2017/0168650 | A1* | 6/2017 | Lee | G06F 3/04166 |
| 2017/0176797 | A1* | 6/2017 | Kim | H01L 27/1248 |
| 2017/0177120 | A1* | 6/2017 | Kyutoku | G06F 3/041 |
| 2017/0185196 | A1* | 6/2017 | Kim | G09G 3/3677 |
| 2017/0262132 | A1* | 9/2017 | Kida | G02F 1/1368 |
| 2017/0301272 | A1* | 10/2017 | Jeon | G01R 27/02 |
| 2017/0309651 | A1* | 10/2017 | Kim | G02F 1/133305 |
| 2018/0026088 | A1* | 1/2018 | Oh | H10K 59/131 |
| | | | | 361/749 |
| 2018/0033355 | A1* | 2/2018 | Lee | H10K 59/88 |
| 2018/0095313 | A1* | 4/2018 | Cao | G02F 1/1345 |
| 2018/0150162 | A1* | 5/2018 | Kim | G06F 11/2221 |
| 2018/0151662 | A1* | 5/2018 | Rhe | H10K 77/111 |
| 2018/0158894 | A1* | 6/2018 | Park | H10K 71/70 |
| 2018/0173335 | A1* | 6/2018 | Gong | G06F 3/044 |
| 2018/0190724 | A1* | 7/2018 | Kang | G06F 3/0446 |
| 2018/0269269 | A1* | 9/2018 | Kim | G06F 3/0446 |
| 2018/0286296 | A1* | 10/2018 | Wang | G09G 3/006 |
| 2018/0336808 | A1* | 11/2018 | Lee | G09G 3/20 |
| 2018/0342185 | A1* | 11/2018 | Lee | G01R 27/08 |
| 2018/0350701 | A1* | 12/2018 | Kim | G02F 1/1345 |
| 2019/0018050 | A1* | 1/2019 | Wang | G06F 3/04164 |
| 2019/0019441 | A1* | 1/2019 | Shin | H10K 71/70 |
| 2019/0066595 | A1* | 2/2019 | Kim | G09G 3/006 |
| 2019/0179206 | A1 | 6/2019 | Cao et al. | |
| 2019/0179461 | A1* | 6/2019 | Baek | G06F 3/0446 |
| 2019/0257875 | A1* | 8/2019 | Hao | H01L 27/124 |
| 2019/0272057 | A1* | 9/2019 | Chen | G06F 3/047 |
| 2019/0279544 | A1* | 9/2019 | Shin | G02F 1/136209 |
| 2019/0288053 | A1* | 9/2019 | Jung | G09G 3/3275 |
| 2019/0294273 | A1* | 9/2019 | Yoshida | G06F 3/0418 |
| 2019/0302942 | A1* | 10/2019 | Kim | H10K 59/88 |
| 2019/0310509 | A1* | 10/2019 | Shin | H01L 27/1255 |
| 2019/0347312 | A1 | 11/2019 | Kondo et al. | |
| 2019/0348478 | A1* | 11/2019 | Kim | G09G 3/006 |
| 2020/0004362 | A1* | 1/2020 | Yang | G06F 3/0443 |
| 2020/0006452 | A1* | 1/2020 | Lee | H01L 27/1255 |
| 2020/0012387 | A1* | 1/2020 | Kim | G06F 3/0443 |
| 2020/0089039 | A1* | 3/2020 | Kanari | G09G 3/3674 |
| 2020/0117312 | A1* | 4/2020 | Kim | G09G 3/006 |
| 2020/0168515 | A1 | 5/2020 | Li | |
| 2020/0273971 | A1 | 8/2020 | Ishikawa et al. | |
| 2020/0287029 | A1 | 9/2020 | Ishikawa et al. | |
| 2020/0333909 | A1 | 10/2020 | Chen et al. | |
| 2021/0028155 | A1 | 1/2021 | Kim | |
| 2021/0096677 | A1 | 4/2021 | Zhang et al. | |
| 2021/0191553 | A1* | 6/2021 | Jang | G06F 3/0412 |
| 2021/0247634 | A1* | 8/2021 | Chen | H01L 22/32 |
| 2021/0349565 | A1 | 11/2021 | Chen et al. | |
| 2023/0105876 | A1* | 4/2023 | Yang | G06F 3/0446 |
| | | | | 345/174 |

FOREIGN PATENT DOCUMENTS

| | | |
|---|---|---|
| KR | 10-1257565 B1 | 4/2013 |
| KR | 2017-0112464 A | 10/2017 |
| KR | 10-2018-0065061 A | 6/2018 |
| KR | 10-2106557 B1 | 5/2020 |

\* cited by examiner

DISPLAY DEVICE AND METHOD OF INSPECTING THE SAME

CROSS-REFERENCE TO RELATED APPLICATIONS

This application is a continuation of U.S. patent application Ser. No. 17/148,289, filed Jan. 13, 2021, which claims priority to and the benefit of Korean Patent Application No. 10-2020-0048323, filed Apr. 21, 2020, the entire content of both of which is incorporated herein by reference.

BACKGROUND

1. Field

The present disclosure relates to a display device including an input sensor, and a method of inspecting a defect of the input sensor.

2. Description of the Related Art

Various display devices applied to multimedia devices, such as televisions, mobile phones, tablet computers, navigation devices, and game devices, are being developed. The display devices may include a keyboard or a mouse as their input device. In addition, the display devices include an input sensor, such as a touch panel, as their input device.

Various defects may occur in the process of manufacturing the display device. The defects may also occur in the input sensor.

SUMMARY

The present disclosure provides a display device including a defect inspection line, and provides a method of inspecting a defect using the defect inspection line.

Embodiments of the present disclosure provide a display device including a display panel and an input sensor on the display panel, the input sensor including sensing electrodes, signal lines connected to the sensing electrodes, an insulating layer on the signal lines, and inspection lines on the insulating layer and electrically connected to each other, each of the inspection lines respectively overlapping a corresponding one of the signal lines.

The display device may further include a dummy electrode under the insulating layer, wherein each of the inspection lines is connected to the dummy electrode through a contact hole through the insulating layer.

The dummy electrode may include a metal material, wherein the inspection lines include a transparent conductive oxide.

The sensing electrodes may include first sensing electrodes extending in a first direction, and second sensing electrodes extending in a second direction crossing the first direction, wherein the signal lines include first signal lines connected to the first sensing electrodes, and second signal lines connected to the second sensing electrodes, and wherein a first one of the first sensing electrodes and the second sensing electrodes include a bridge pattern of which a portion is under the insulating layer, and a sensing pattern on the insulating layer and connected to the bridge pattern.

A second one of the first sensing electrodes and the second sensing electrodes may be on a same layer as the sensing pattern.

The bridge pattern and the dummy electrode may include a same material, wherein the sensing pattern and the inspection lines include a same material.

The display panel may include an active area in which pixels are arranged, a peripheral area adjacent to the active area, and pad electrodes overlapping the peripheral area and on the insulating layer, wherein each of the first signal lines includes a line portion including a same material as the portion of the bridge pattern, and a pad portion extending from an end of the line portion and connected to a corresponding one of the pad electrodes through a contact hole in the insulating layer.

Each of the inspection lines may include an inspection line portion on the insulating layer, and an inspection pad portion extending from an end of the inspection line portion and aligned with the pad portion in the first direction.

The first sensing electrodes may include n first sensing electrodes, "n" being a natural number equal to or greater than 2, wherein the inspection lines include first inspection lines corresponding to first-group signal lines connected to first to i-th first sensing electrodes among the n first sensing electrodes, "i" being a natural number smaller than "n," and second inspection lines corresponding to second-group signal lines connected to (i+1)th to n-th first sensing electrodes among the n first sensing electrodes, wherein the dummy electrode includes first dummy electrodes and second dummy electrodes, wherein the first inspection lines are connected to one of the first dummy electrodes, and wherein the second inspection lines are connected to one of the second dummy electrodes.

The display panel may include an active area in which pixels are arranged, and a peripheral area adjacent to the active area, wherein the first-group signal lines, the second-group signal lines, the first dummy electrodes, and the second dummy electrodes are in the peripheral area, wherein the first-group signal lines and the first dummy electrodes are at one side of the active area in the first direction, and wherein the second-group signal lines and the second dummy electrodes are at the other side of the active area in the first direction.

One of the second dummy electrodes to which the second inspection lines are connected may be between the second-group signal lines and the active area in the first direction.

One of the first dummy electrodes to which the first inspection lines are connected may include a plurality of unit areas having different widths, wherein one of the first-group signal lines includes a plurality of unit areas having different widths, and wherein a unit area having a largest width among the unit areas of the one of the first dummy electrodes to which the first inspection lines are connected is closest to a unit area having a smallest width among the unit areas of the one of the first-group signal lines.

The inspection lines may have an integral shape.

The display panel may include a first base substrate, a second base substrate facing the first base substrate, a circuit element layer between the first base substrate and the second base substrate on an inner surface of the first base substrate, and a light emitting element layer on the circuit element layer.

A portion of the sensing electrodes and the insulating layer may be in contact with an outer surface of the second base substrate.

One of the signal lines may have a line width that is smaller than a line width of one of the inspection lines corresponding to the one of the signal lines.

Embodiments of the present disclosure provide a display device including a display panel including a display panel including an active area in which pixels are arranged, and a peripheral area adjacent to the active area, and an input sensor on the display panel, the input sensor including sensing electrodes overlapping the active area, signal lines overlapping the peripheral area and connected to the sensing electrodes, an insulating layer covering the signal lines, and inspection lines overlapping some of the signal lines, on the insulating layer, and electrically connected to each other.

The sensing electrodes may include first sensing electrodes extending in a first direction, and second sensing electrodes extending in a second direction crossing the first direction, wherein each of the inspection lines includes a curved portion, and an extension portion extending from the curved portion in the second direction.

One of the inspection lines includes an overlap portion that overlaps the signal lines, and a non-overlap portion that does not overlap the signal lines.

Embodiments of the present disclosure provide a method of inspecting a display device including a display panel, and an input sensor on the display panel, the input sensor including first sensing electrodes, second sensing electrodes crossing the first sensing electrodes, first signal lines connected to the first sensing electrodes, second signal lines connected to the second sensing electrodes, an insulating layer covering the first signal lines and the second signal lines, and inspection lines on the insulating layer, overlapping the first signal lines, and electrically connected to each other, the method including applying a first inspection signal to the first signal lines or the second signal lines to inspect an operation of the input sensor, and applying a second inspection signal to the inspection lines to inspect a defect of the inspection lines.

The second inspection signal may be applied to the inspection lines when the first inspection signal is applied to the first signal lines.

According to the above, defects occurring in the input sensor may be checked, and the signal lines of the input sensor may be protected.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Figure 1A:
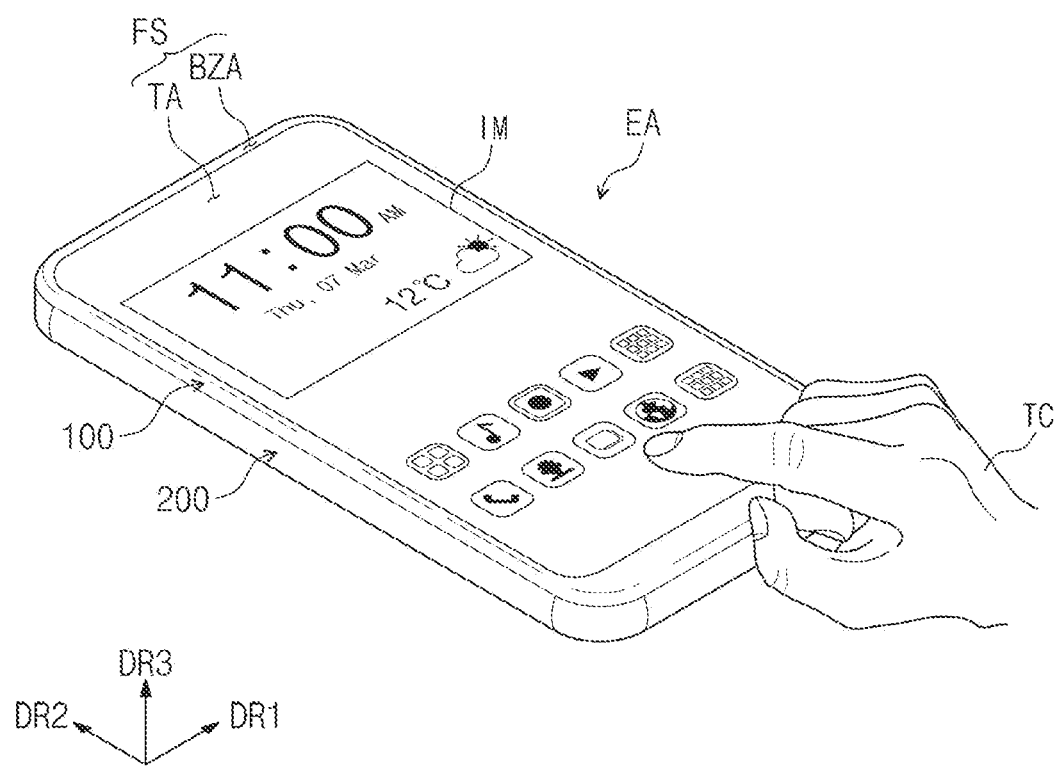
FIG. 1A is a perspective view showing a display device according to some embodiments of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described with reference to accompanying drawings.

Figure 1B:
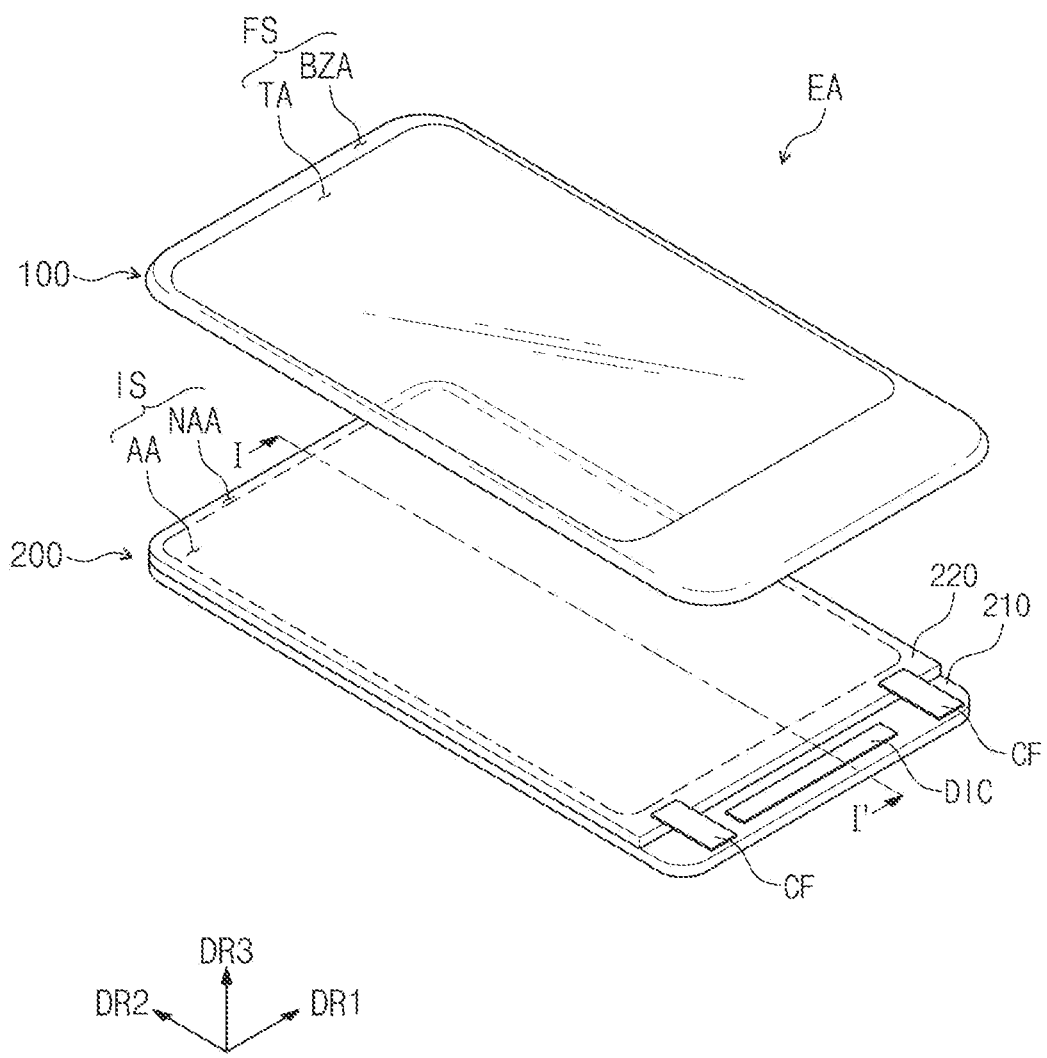
FIG. 1B is an exploded perspective view showing a display device according to some embodiments of the present disclosure.
Figure 1C:
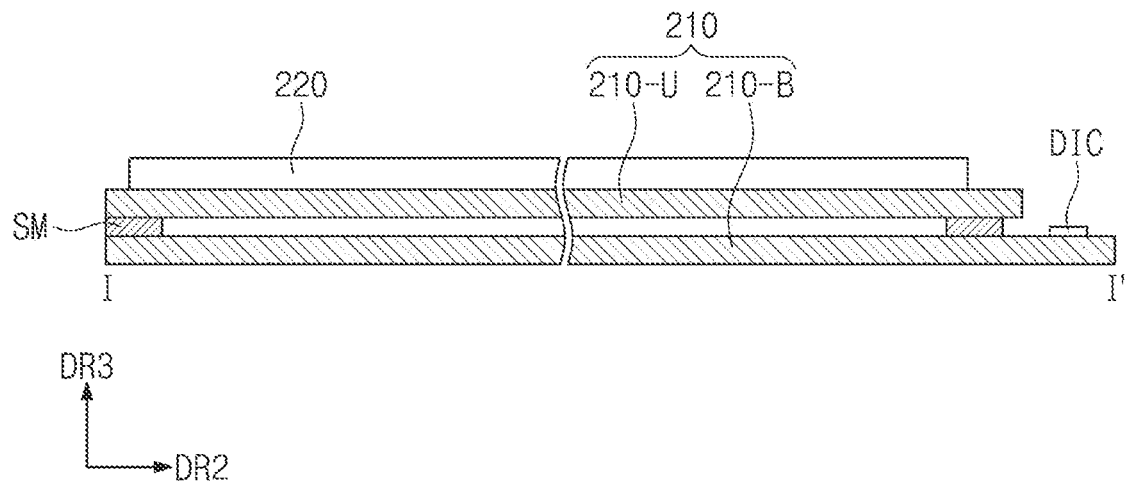
FIGS. 1C and 1D are cross-sectional views taken along the line I-I' of FIG. 1B.
Figure 1D:
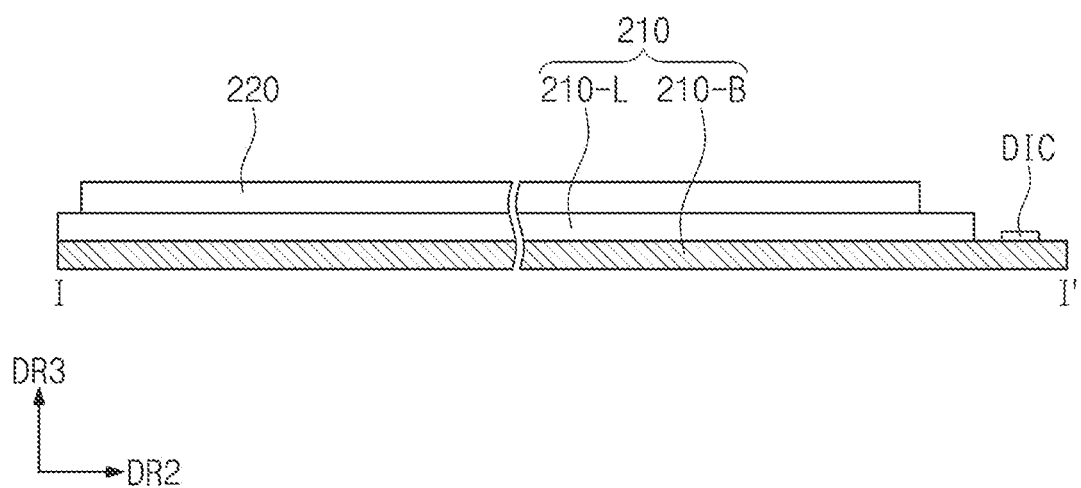

FIG. 1A is a perspective view showing a display device EA according to some embodiments of the present disclosure, FIG. 1B is an exploded perspective view showing the display device EA shown in FIG. 1A, and FIGS. 1C and 1D are cross-sectional views taken along the line I-I' of FIG. 1B. Hereinafter, the display device EA according to some embodiments will be described with reference to FIGS. 1A to 1D.

The display device EA may be activated in response to electrical signals. The display device EA may correspond to various embodiments. For example, the display device EA may include a tablet computer, a notebook computer, a computer, a smart television or the like. In some embodiments, a smartphone will be described as one example of the display device EA.

The display device EA displays an image IM through a display surface FS. The display surface FS is substantially parallel to a surface defined by a first direction DR1 and a second direction DR2. A third direction DR3 indicates a normal line direction of the display surface FS (e.g., a thickness direction of the display device EA). Front (or upper) and rear (or lower) surfaces of each member or each unit described below are distinguished from each other with respect to the third direction DR3. Hereinafter, the first, second, and third directions DR1, DR2, and DR3 respectively correspond to directions indicated by first, second, and third directional axes, and are assigned with the same reference numerals as the first, second, and third directional axes.

The display surface FS through which the image IM is displayed may correspond to a front surface of the display device EA and a front surface FS of a window member 100. Hereinafter, the display surface and the front surface of the display device EA and the front surface of the window member 100 are assigned with the same reference numeral. FIG. 1A shows an image of a clock, and a plurality of application icons as one example of the image IM.

The display device EA includes the window member 100 and an electronic panel 200. In some embodiments, the display device EA further includes an optical member located between the window member 100 and the electronic panel 200. According to some embodiments, the optical member may include a polarizer, and/or may include a color filter member to reduce a reflectance of an external light.

The window member 100 includes a base panel. For example, the base panel includes glass, plastic, or a combination thereof. The front surface FS of the window member 100 includes a transmission area TA and a bezel area BZA. The transmission area TA may be optically transparent. For example, the transmission area TA may have a transmittance of about 90% or more with respect to a visible light.

The bezel area BZA has a light transmittance that is relatively lower than that of the transmission area TA. The bezel area BZA defines a shape of the transmission area TA. The bezel area BZA is defined adjacent to the transmission area TA, and surrounds the transmission area TA. The window member 100 further includes a light blocking pattern located on the base panel to define the bezel area BZA.

The bezel area BZA may have a color (e.g., a predetermined color). The bezel area BZA covers a peripheral area NAA of the electronic panel 200 to reduce or prevent visibility of the peripheral area NAA from the outside. However, this is merely one example, and all or a portion of the bezel area BZA may be omitted from the window member 100 according to some embodiments of the present disclosure.

The electronic panel 200 displays the image IM and senses an external input TC. The image IM is displayed through a front surface FS of the electronic panel 200. The front surface FS of the electronic panel 200 includes an active area AA and the peripheral area NAA. The active area AA is activated in response to an electrical signal. The active area AA may be an area that overlaps pixels PX (refer to FIG. 2B), which will be described later.

In some embodiments, the active area AA is an area through which the image IM is displayed, and through which the external input TC is sensed. The active area AA corresponds to the transmission area TA, and the peripheral area NAA corresponds to the bezel area BZA. In the present disclosure, the expression "an area/portion corresponds to another area/portion" may mean that "an area/portion overlaps another area/portion," but the expression should not be limited to "an area/portion has the same area and/or the same shape as another area/portion".

The electronic panel 200 includes a display panel 210, an input sensor 220, a driving circuit DIC, and a circuit board CF. In some embodiments, two circuit boards CF are shown as one example.

The display panel 210 substantially displays the image IM. The display panel 210 may be a light emitting display panel. For instance, the light emitting display panel may be an organic light emitting display panel, a quantum dot light emitting display panel, or a micro LED light emitting display panel. The panels are distinct from each other depending on a material of a light emitting element. A light emitting layer of the organic light emitting display panel may include an organic light emitting material. A light emitting layer of the quantum dot light emitting display panel may include a quantum dot and/or a quantum rod. A light emitting layer of the micro LED light emitting display panel may include a plurality of micro-LEDs. Hereinafter, the organic light emitting display panel will be described as one example of the display panel 210.

The input sensor 220 senses an external input (e.g., a touch event) applied thereto from the outside. In some embodiments, the input sensor 220 is a capacitive type touch sensor, however, it is not particularly limited in other embodiments.

The driving circuit DIC is located on the display panel 210. The driving circuit DIC is mounted on the display panel 210. The driving circuit DIC is electrically connected to the display panel 210, and applies electrical signals to the display panel 210 to drive the display panel 210.

The circuit board CF is electrically connected to the input sensor 220. In some embodiments, a sensing driving circuit may be mounted on the circuit board CF. The circuit board CF electrically connects the input sensor 220 to the display panel 210, or electrically connects the input sensor 220 to another circuit board.

Referring to FIG. 1C, the display panel 210 includes a display substrate 210-B, an encapsulation substrate 210-U, and a sealing member SM attaching the display substrate 210-B to the encapsulation substrate 210-U. The display substrate 210-B includes the pixels PX (refer to FIG. 2B) that substantially generate images. The encapsulation substrate 210-U encapsulates the pixels to reduce or prevent damage to the pixels due to external moisture or the like.

The driving circuit DIC may be coupled to the display substrate 210-B. The driving circuit DIC may be provided in the form of an integrated chip, however, it should not be limited thereto or thereby. In some embodiments, the driving circuit DIC might not be mounted on the display substrate 210-B.

The display substrate 210-B and the encapsulation substrate 210-U may include a glass substrate as their base substrate. The display substrate 210-B may have an area that is greater than that of the encapsulation substrate 210-U. The driving circuit DIC may be located in an area of the display substrate 210-B that is exposed without being covered by the encapsulation substrate 210-U, although it should not be limited thereto or thereby. That is, the display substrate 210-B and the encapsulation substrate 210-U may have substantially the same shape as each other. An outer surface (or an upper surface) of the encapsulation substrate 210-U may provide a base surface on which the input sensor 220 is located.

The sealing member SM may include a frit. The frit may be a ceramic adhesive material, and may have a property of being cured after being exposed to a laser beam. The frit may contain about 15 to about 40 wt % of $V_2O_5$, about 10 to about 30 wt % of $TeO_2$, about 1 to about 15 wt % of $P_2O_5$, about 1 to about 20 wt % of ZnO, about 5 to about 30 wt % of $ZrO_2$, about 5 to about 20 wt % of $WO_3$, or about 1 to about 15 wt % of BaO as a main component, and may contain at least one of $Fe_2O_3$, CuO, MnO, $Al_2O_3$, $Na_2O$, and $Nb_2O_5$ as an additive. The frit of such a composition may have a coefficient of thermal expansion of about $40 \times 10-7/°$ C. to about $100 \times 10-7/°$ C., and may have a glass transition temperature of about 250° C. The sealing member SM may overlap the peripheral area NAA.

Referring to FIG. 1D, a display panel 210 includes a display substrate 210-B and a thin film encapsulation layer 210-L. The thin film encapsulation layer 210-L encapsulates a display element layer 210-OLED (refer to FIG. 2A). In some embodiments, the thin film encapsulation layer 210-L may include at least one inorganic layer. In some embodiments, the thin film encapsulation layer 210-L may include a plurality of inorganic layers and a plurality of organic layers. In some embodiments, the thin film encapsulation layer 210-L may have a stack structure of inorganic layer/organic layer/inorganic layer. An uppermost layer of the thin film encapsulation layer 210-L may provide a base surface on which an input sensor 220 is located. Hereinafter, the display panel 210 will be described with reference to the structure of the display panel 210 of FIG. 1C.

Figure 2A:
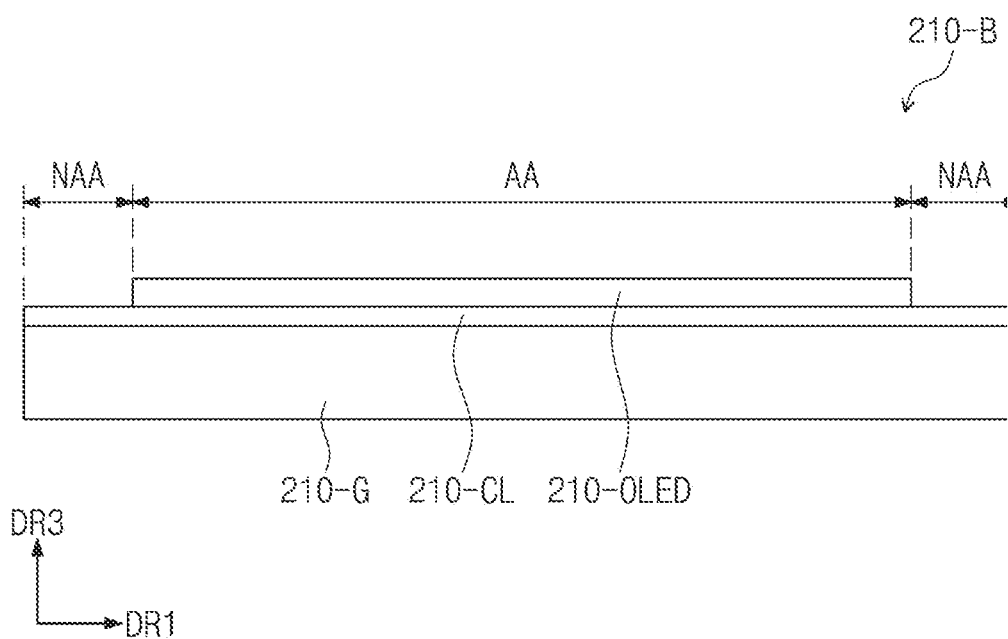
FIG. 2A is a cross-sectional view showing a display substrate according to some embodiments of the present disclosure.
Figure 2B:
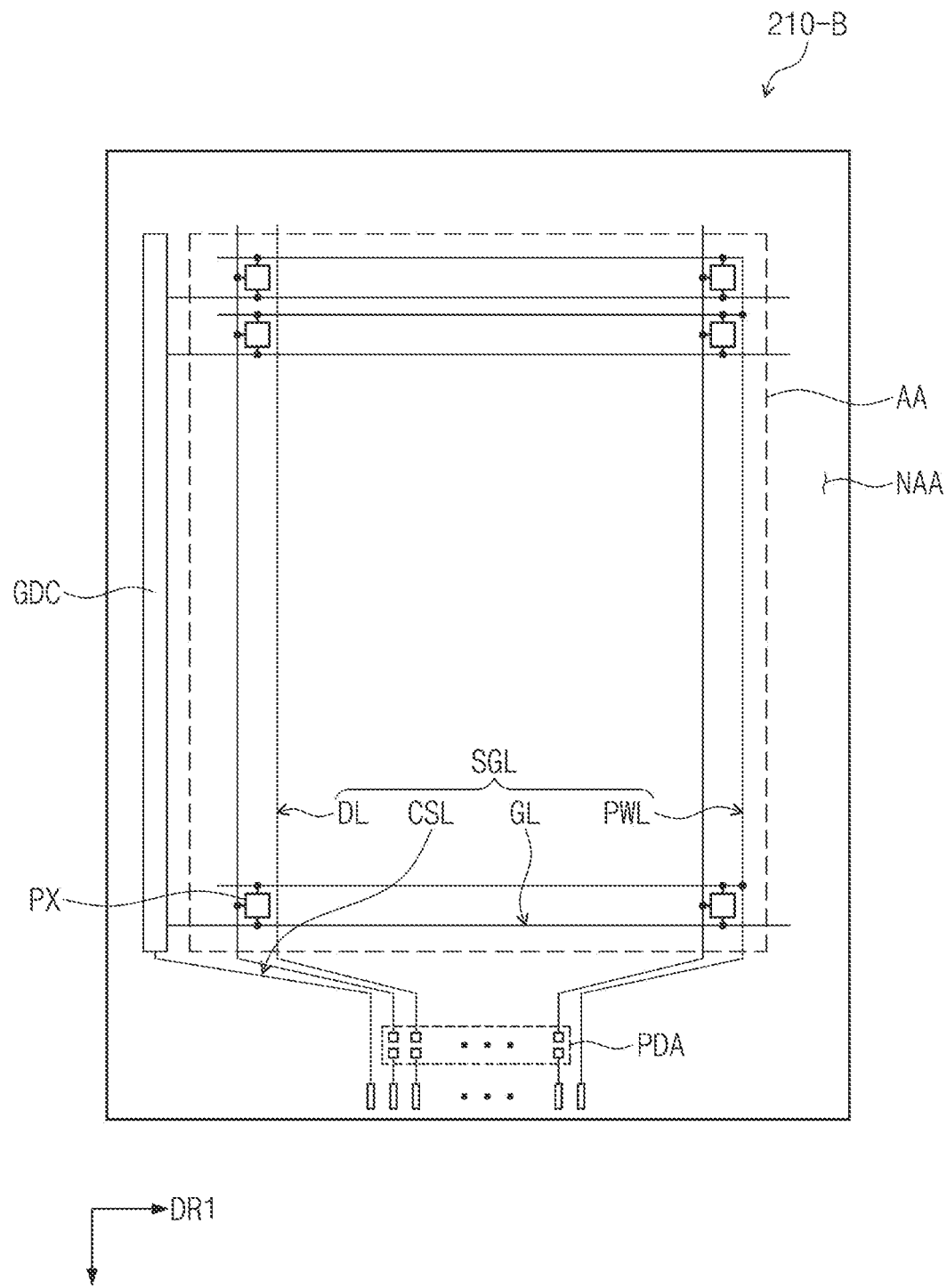
FIG. 2B is a plan view showing a display substrate according to some embodiments of the present disclosure.

FIG. 2A is a cross-sectional view showing the display substrate 210-B according to some embodiments of the present disclosure, and FIG. 2B is a plan view showing the display substrate 210-B according to some embodiments of the present disclosure. Hereinafter, the display substrate 210-B according to some embodiments of the present disclosure will be described with reference to FIGS. 2A and 2B.

Referring to FIG. 2A, the display substrate 210-B includes a base substrate 210-G (hereinafter, referred to as a "first base substrate"), a circuit element layer 210-CL located on an upper surface (or an inner surface) of the first base substrate 210-G, and the display element layer 210-OLED. The display substrate 210-B may further include an insulating layer that covers the display element layer 210-OLED.

The first base substrate 210-G includes a glass substrate, a metal substrate, or an organic-inorganic composite substrate. The circuit element layer 210-CL includes at least one insulating layer and a circuit element. The insulating layer includes at least one inorganic layer and at least one organic layer. The circuit element includes signal lines and a pixel driving circuit. The display element layer 210-OLED includes organic light emitting diodes as light emitting elements thereof. The display element layer 210-OLED may further include an organic layer such as a pixel definition layer.

Referring to FIG. 2B, the display substrate 210-B includes a driving circuit GDC, a plurality of signal lines SGL, and a plurality of pixels PX.

The driving circuit GDC includes a scan driving circuit. The scan driving circuit generates a plurality of scan signals and sequentially outputs the scan signals to a plurality of scan lines GL described later. The scan driving circuit may further output another control signal to a driving circuit of the pixels PX.

The scan driving circuit may include a plurality of thin film transistors formed through the same processes (e.g., a low temperature polycrystalline silicon (LTPS) process and/or a low temperature polycrystalline oxide (LTPO) process) as the driving circuit of the pixels PX.

The signal lines SGL include the scan lines GL, data lines DL, a power line PWL, and a control signal line CSL. Each of the scan lines GL is connected to a corresponding pixel among the pixels PX, and each of the data lines DL is connected to a corresponding pixel among the pixels PX. The power line PWL is connected to the pixels PX. The control signal line CSL provides control signals to the scan driving circuit.

FIG. 2B shows a mounting area PDA in which the driving circuit DIC (refer to FIG. 1C) is located. The driving circuit DIC is connected to the data lines DL.

Figure 3:
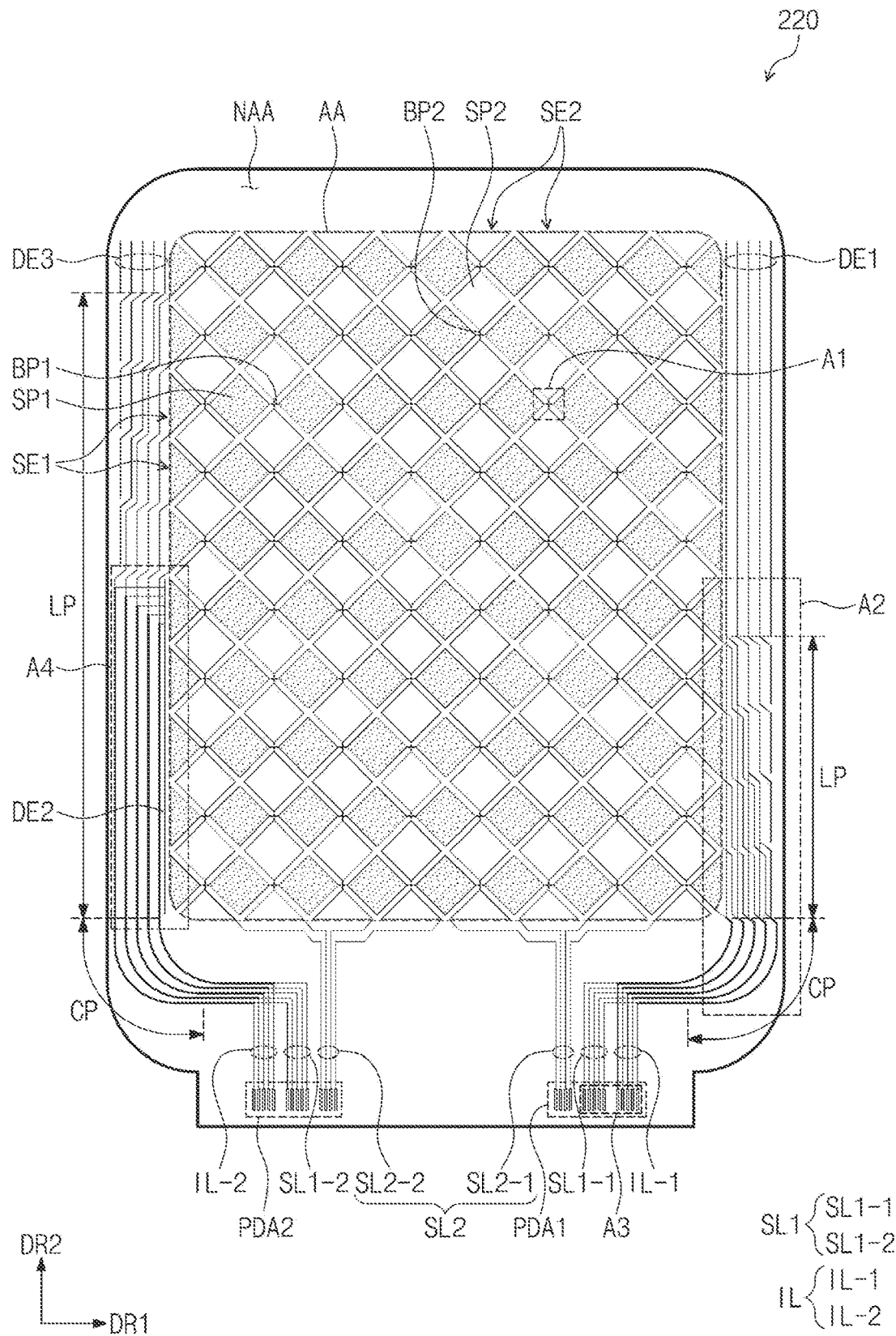
FIG. 3 is a plan view showing an input sensor according to some embodiments of the present disclosure.

FIG. 3 is a plan view showing the input sensor 220 according to some embodiments of the present disclosure. The input sensor 220 may be located on the display panel 210 (refer to FIG. 1B). The input sensor 220 may include a plurality of sensing electrodes SE1 and SE2, and a plurality of signal lines SL1 and SL2 connected to the sensing electrodes SE1 and SE2.

The sensing electrodes SE1 and SE2 may overlap the active area AA. The sensing electrodes SE1 and SE2 may include a plurality of first sensing electrodes SE1, and a plurality of second sensing electrodes SE2 crossing the first sensing electrodes SE1. The first sensing electrodes SE1 may extend in the first direction DR1 and may be arranged in the second direction DR2. Each of the first sensing electrodes SE1 may include a plurality of first sensing portions SP1 and a plurality of first intermediate portions BP1, which are arranged in the first direction DR1.

The second sensing electrodes SE2 may extend in the second direction DR2 and may be arranged in the first direction DR1. Each of the second sensing electrodes SE2 may include a plurality of second sensing portions SP2 and a plurality of second intermediate portions BP2, which are arranged in the second direction DR2.

The signal lines SL1 and SL2 may overlap the peripheral area NAA. The signal lines SL1 and SL2 may include a plurality of first signal lines SL1 and a plurality of second signal lines SL2. The first signal lines SL1 may be respectively connected to one of the ends of opposite ends of the first sensing electrodes SE1. The second signal lines SL2 may be respectively connected to one of the ends of opposite ends of the second sensing electrodes SE2. However, a connection relationship between the sensing electrodes SE1 and SE2 and the signal lines SL1 and SL2 should not be limited thereto or thereby.

The first sensing electrodes SE1 may include n sensing electrodes, "n" being a natural number that is equal to or greater than 2. FIG. 3 shows ten first sensing electrodes as one example. The first signal lines SL1 may include first-group signal lines SL1-1 connected to some of the n sensing electrodes, and second-group signal lines SL1-2 connected to the other sensing electrodes of the n sensing electrodes. The first-group signal lines SL1-1 may be respectively connected to some ends of first to i-th sensing electrodes, while the second-group signal lines SL1-2 may be respectively connected to the other ends of (i+1)th to n-th sensing electrodes. In the present example, "i" is 5.

The input sensor 220 may include inspection lines IL that overlap corresponding signal lines of the signal lines SL1 and SL2, and that are electrically connected to each other. In some embodiments, the inspection lines IL may include first inspection lines IL-1 corresponding to the first-group signal lines SL1-1, and second inspection lines IL-2 corresponding to the second-group signal lines SL1-2. The first inspection lines IL-1 may be electrically connected to each other, and the second inspection lines IL-2 may be electrically connected to each other. The inspection lines IL will be described in detail below.

Among the first inspection lines IL-1 and the first-group signal lines SL1-1, the inspection line and the signal line, which corresponds to the inspection line, may partially overlap each other. The first inspection lines IL-1 and the first-group signal lines SL1-1 may include curved portions CP located at corner areas, and as shown in FIG. 3, the overlapping portion(s) thereof may include the curved portion CP. The first inspection lines IL-1 and the first-group signal lines SL1-1 may further include an extension portion LP extending in the second direction DR2 from the curved portion CP. The extension portion LP of the first inspection lines IL-1, and the extension portion LP of the first-group signal lines SL1-1, might not overlap each other.

Among the second inspection lines IL-2, one inspection line corresponding to one signal line among the second-group signal lines SL1-2, and the one signal line, may partially overlap each other. The second inspection lines IL-2 and the second-group signal lines SL1-2 may include curved portions CP located at corner areas, and as shown in FIG. 3, the overlapping portion(s) thereof may include the curved portion CP. The overlapping portion may further include an extension portion LP extending in the second direction DR2 from the curved portion CP. In some embodiments, only a portion of the extension portion LP of the second-group signal lines SL1-2 corresponds to the overlapping portion.

Figure 6A:
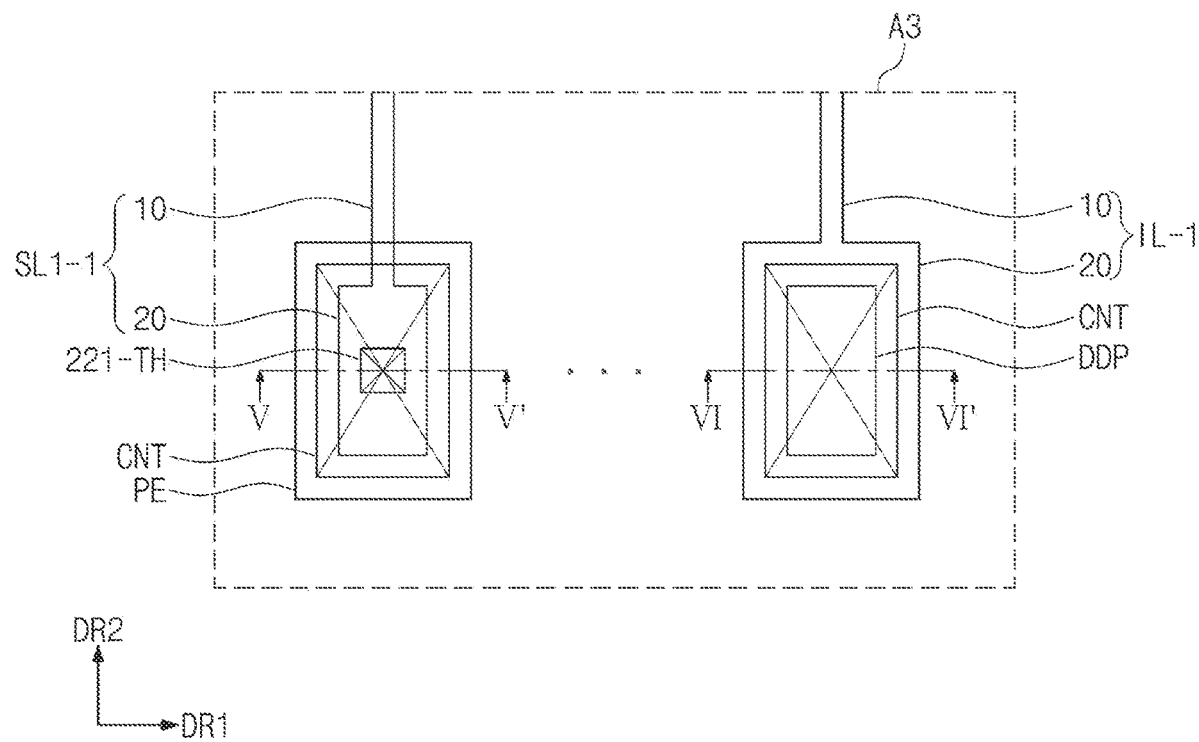
FIG. 6A is a plan view showing a third area of FIG. 3.

Each of the signal lines SL1 and SL2 and the inspection lines IL may include a line portion 10 and a pad portion 20 (refer to FIG. 6A). A pad portion 20 (refer to FIG. 6A) of some signal lines SL2-1 among the second signal lines SL2 may be aligned with a pad portion 20 of the first-group signal lines SL1-1 in the first direction DR1. A pad portion 20 of the first inspection lines IL-1 may be aligned with the pad portion 20 of the first-group signal lines SL1-1 in the first direction DR1. A pad portion 20 of the other signal lines SL2-2 among the second signal lines SL2 may be aligned with a pad portion 20 of the second-group signal lines SL1-2 in the first direction DR1. FIG. 3 shows two pad areas PDA1 and PDA2 distinguished from each other.

The input sensor 220 may further include dummy electrodes DE1, DE2, and DE3. The dummy electrodes DE1, DE2, and DE3 may be located in an area in which the signal lines SL1 and SL2 are not located in the peripheral area NAA. The dummy electrodes DE1, DE2, and DE3 may be located in the area of the peripheral area NAA to correct a reflectance of an external light, so that the area where the signal lines SL1 and SL2 are located and the area where the signal lines SL1 and SL2 are not located in the peripheral area NAA are not distinguished from each other. The dummy electrodes DE1, DE2, and DE3 may include the same material as the signal lines SL1 and SL2.

FIG. 3 shows three groups of dummy electrodes DE1, DE2, and DE3, which are distinguished from each other. A first dummy electrode DE1 may be located at one side of the active area AA, and the second and third dummy electrodes DE2 and DE3 may be located at the other side of the active area AA (with respect to the first direction DR1). Each of the first dummy electrode DE1, the second dummy electrode DE2, and the third dummy electrode DE3 may include a plurality of electrodes.

The first dummy electrode DE1 may be located farther from a first pad area PDA1 than the first-group signal lines SL1-1 are, and the third dummy electrode DE3 may be located farther from a second pad area PDA2 than the second-group signal lines SL1-2 are. The first dummy electrode DE1 may be located to compensate for the area in which the first-group signal lines SL1-1 are not located in the peripheral area NAA, and the third dummy electrode DE3 may be located to compensate for the area in which the second-group signal lines SL1-2 are not located in the peripheral area NAA. The second dummy electrode DE2 may be located between the second-group signal lines SL1-2 and the active area AA in the first direction DR1.

Figure 4A:
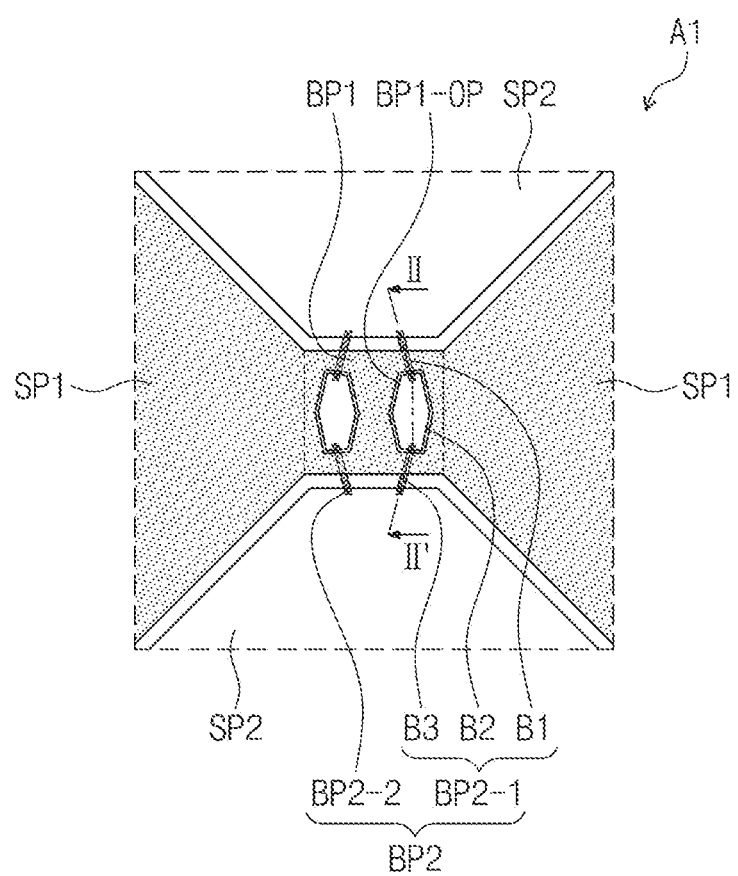
FIG. 4A is a plan view showing a first area of FIG. 3.
Figure 4B:
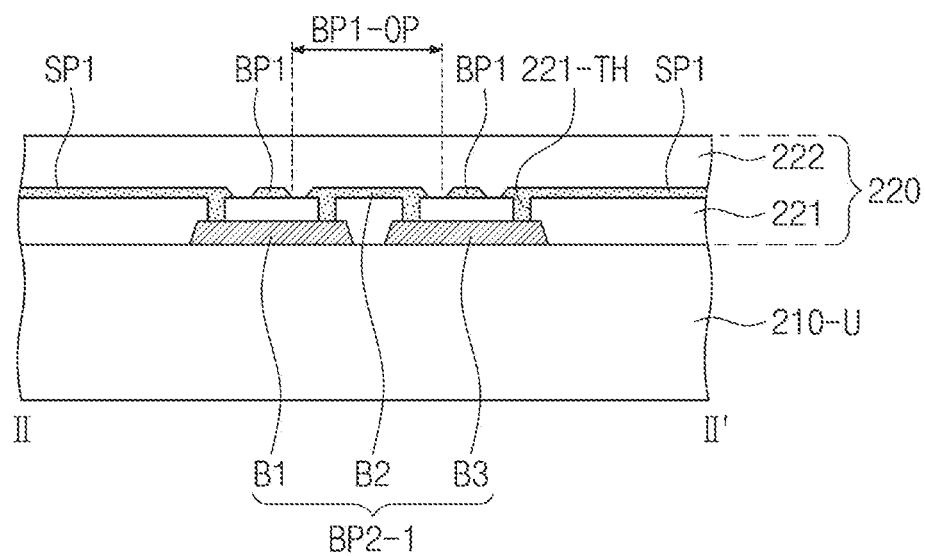
FIG. 4B is a cross-sectional view taken along the line II-II' of FIG. 4A.

FIG. 4A is a plan view showing a first area A1 of FIG. 3, and FIG. 4B is a cross-sectional view taken along the line II-II' of FIG. 4A. Hereinafter, the input sensor 220 will be described in detail with reference to FIGS. 3, 4A, and 4B.

Referring to FIGS. 4A and 4B, the first area A1 may correspond to a cross-area of the first sensing electrode SE1 and the second sensing electrode SE2 (e.g., an area at which the first sensing electrode SE1 and the second sensing electrode SE2 cross each other). The first intermediate portion BP1 and the second intermediate portion BP2 may be located in the cross-area. In some embodiments, the first sensing portion SP1 and the first intermediate portion BP1 may be provided integrally with each other, and the second sensing portion SP2 and the second intermediate portion BP2 may be provided separately from each other, although they should not be limited thereto or thereby. According to other embodiments, the first sensing portion SP1 and the first intermediate portion BP1 may be provided separately from each other, and the second sensing portion SP2 and the second intermediate portion BP2 may be provided integrally with each other.

A sensing portion and an intermediate portion, which are provided separately from each other, may be defined as an electrode pattern and a bridge pattern, respectively. That is, in some embodiments, the second sensing electrode SE2 may include electrode patterns SP2 and bridge patterns BP2. FIGS. 4A and 4B show two bridge patterns BP2-1 and BP2-2 located in one cross-area, however, the number of the bridge patterns should not be limited thereto or thereby.

In some embodiments, the bridge pattern BP2 may include a first portion B1, a second portion B2, and a third portion B3. The second portion B2 may be located on a layer that is different from a layer on which the first and third portions B1 and B3 are located. The second portion B2 may be located on the same layer as the electrode patterns SP2.

As shown in FIGS. 4A and 4B, the input sensor 220 may be located directly on an outer surface (or upper surface) of the encapsulation substrate 210-U. In some embodiments, the encapsulation substrate 210-U that includes only a base substrate (hereinafter, referred to as a "second base substrate") is shown as one example, although it should not be limited thereto or thereby. In some embodiments, a portion of the bridge pattern BP2 is in contact directly with the upper surface of the encapsulation substrate 210-U, although it should not be limited thereto or thereby. According to other embodiments, a buffer layer may be further located on the upper surface of the encapsulation substrate 210-U, and a portion of the bridge pattern BP2 may be in contact directly with the upper surface of the buffer layer. The buffer layer may include an inorganic layer/an organic layer.

According to other embodiments, the input sensor 220 might not be located directly on the encapsulation substrate 210-U, and in this case, an adhesive layer may be located between the input sensor 220 and the encapsulation substrate 210-U. The base layer of the input sensor 220 may be coupled to the encapsulation substrate 210-U by the adhesive layer.

According to some embodiments, at least the portion of the bridge pattern BP2 may be in contact with the upper surface of the encapsulation substrate 210-U. The first portion B1 and the third portion B3 may be located on the upper surface of the encapsulation substrate 210-U. The first portion B1 and the third portion B3 may include a metal material. The first portion B1 and the third portion B3 may include titanium (Ti), aluminum (Al), copper (Cu), gold (Au), silver (Ag), or the like. The first portion B1 and the third portion B3 may be a multi-layer structure that includes a metal layer containing the metal material.

A first insulating layer 221 may be located on the upper surface of the encapsulation substrate 210-U. The first sensing electrode SE1, the electrode patterns SP2, and the second portion B2 may be located on the first insulating layer 221. The first intermediate portion BP1 may be provided with an opening BP1-OP defined therethrough to accommodate the second portion B2. The electrode patterns SP2 and the second portion B2 may be connected to the bridge pattern BP2 through a through hole 221-TH defined through the first insulating layer 221.

The first sensing electrode SE1, the electrode patterns SP2, and the second portion B2 may include the same material. The first sensing electrode SE1, the electrode patterns SP2, and the second portion B2 may include a transparent conductive oxide (TCO). The first sensing electrode SE1, the electrode patterns SP2, and the second portion B2 may include indium tin oxide (ITO), indium zinc oxide (IZO), zinc oxide (ZnO), indium tin zinc oxide (ITZO), PEDOT, a metal nanowire, or a graphene.

A second insulating layer 222 may be located on the first insulating layer 221. The second insulating layer 222 may cover the first sensing electrode SE1, the electrode patterns SP2, and the second portion B2. The first insulating layer 221 and the second insulating layer 222 may include an inorganic material and/or an organic material. Each of the first insulating layer 221 and the second insulating layer 222 may have a single-layer or multi-layer structure.

In some embodiments, the bridge pattern BP2 may include only a metal pattern located on the upper surface of the encapsulation substrate 210-U. The bridge pattern BP2 might not cross the first intermediate portion BP1. The bridge pattern BP2 may overlap the first sensing portions SP1 to bypass the first intermediate portion SP1. In this case, the second portion B2 may be located inside the first sensing portion SP1 (e.g., in a plan view).

Figure 5A:
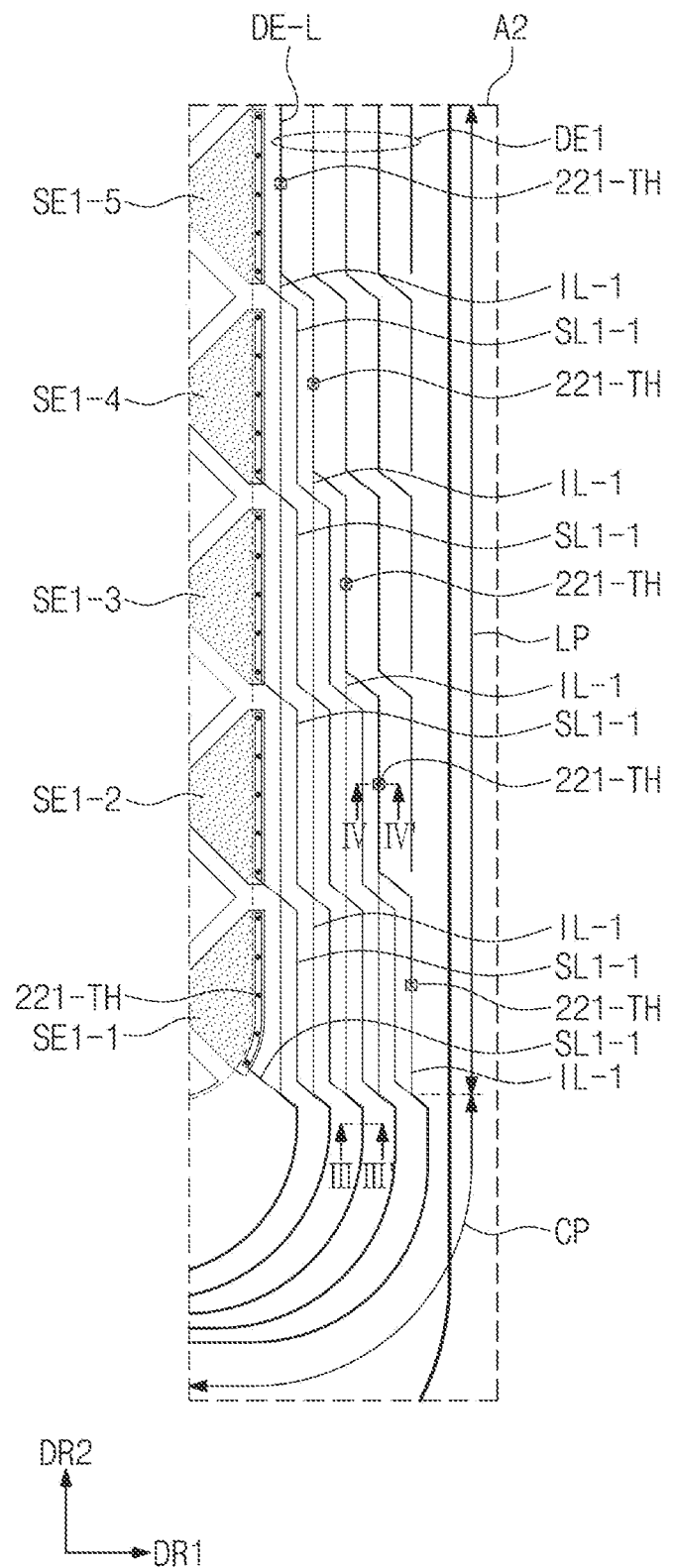
FIG. 5A is a plan view showing a second area of FIG. 3.
Figure 5B:
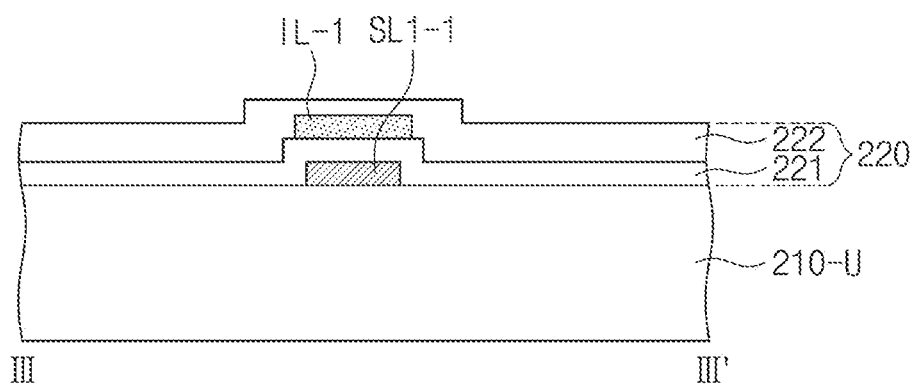
FIG. 5B is a cross-sectional view taken along the line III-III' of FIG. 5A.
Figure 5C:
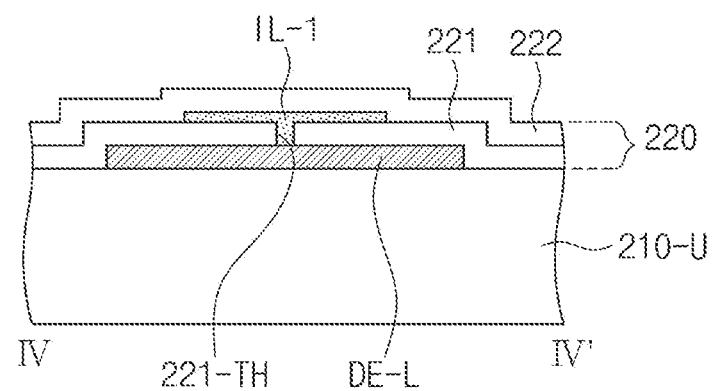
FIG. 5C is a cross-sectional view taken along the line IV-IV' of FIG. 5A.

FIG. 5A is a plan view showing a second area A2 of FIG. 3, FIG. 5B is a cross-sectional view taken along the line III-III' of FIG. 5A, and FIG. 5C is a cross-sectional view taken along the line IV-IV' of FIG. 5A. Hereinafter, the second area A2 will be described in detail with reference to FIGS. 3, 4A, 4B, 5A, and 5B.

Respective ends of five sensing electrodes SE1-1 to SE1-5 may be respectively connected to extension portions LP of the first-group signal lines SL1-1. The five sensing electrodes SE1-1 to SE1-5 may be respectively connected to respective ones of the first-group signal lines SL1-1 via through holes 221-TH.

Referring to FIGS. 5A and 5B, the curved portion CP of the first inspection lines IL-1 may overlap the curved portion CP of the first-group signal lines SL1-1. As shown in FIG. 5B, the first inspection line IL-1 may be located on the first insulating layer 221, and may have a line width that is greater than that of the first-group signal line SL1-1. The first inspection line IL-1 may include the same material as the first sensing portions SP1 (refer to FIG. 4B), the electrode patterns SP2 (refer to FIG. 4B), and the second portion B2 (refer to FIG. 4B). The first inspection line IL-1 may include a transparent conductive oxide (TCO). In some embodiments, the second inspection lines IL-2 may be located on the same layer as, and may include the same material as, the first inspection lines IL-1.

As shown in FIGS. 5A and 5B, the extension portion LP of the first inspection lines IL-1 might not overlap the extension portion LP of the first-group signal lines SL1-1. The extension portion LP of the first inspection lines IL-1 may be connected to the first dummy electrode DE1. The first inspection lines IL-1, which are all connected to a longest dummy electrode DE-L among a plurality of first dummy electrodes DE1, are shown. The first inspection lines IL-1 may be electrically connected to each other through the longest dummy electrode DE-L. As shown in FIG. 5C, the first inspection lines IL-1 may be connected to the longest dummy electrode DE-L via the through hole 221-TH defined by, or passing through, the first insulating layer 221.

Figure 6B:
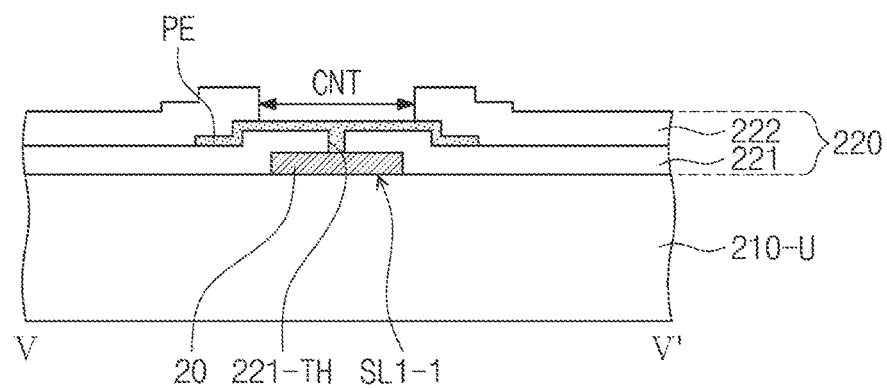
FIG. 6B is a cross-sectional view taken along the line V-V' of FIG. 6A.
Figure 6C:
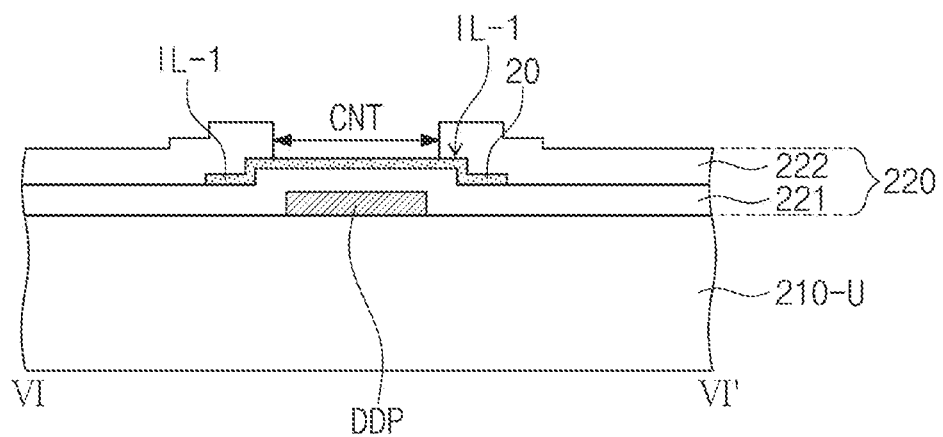
FIG. 6C is a cross-sectional view taken along the line VI-VI' of FIG. 6A.
Figure 7:
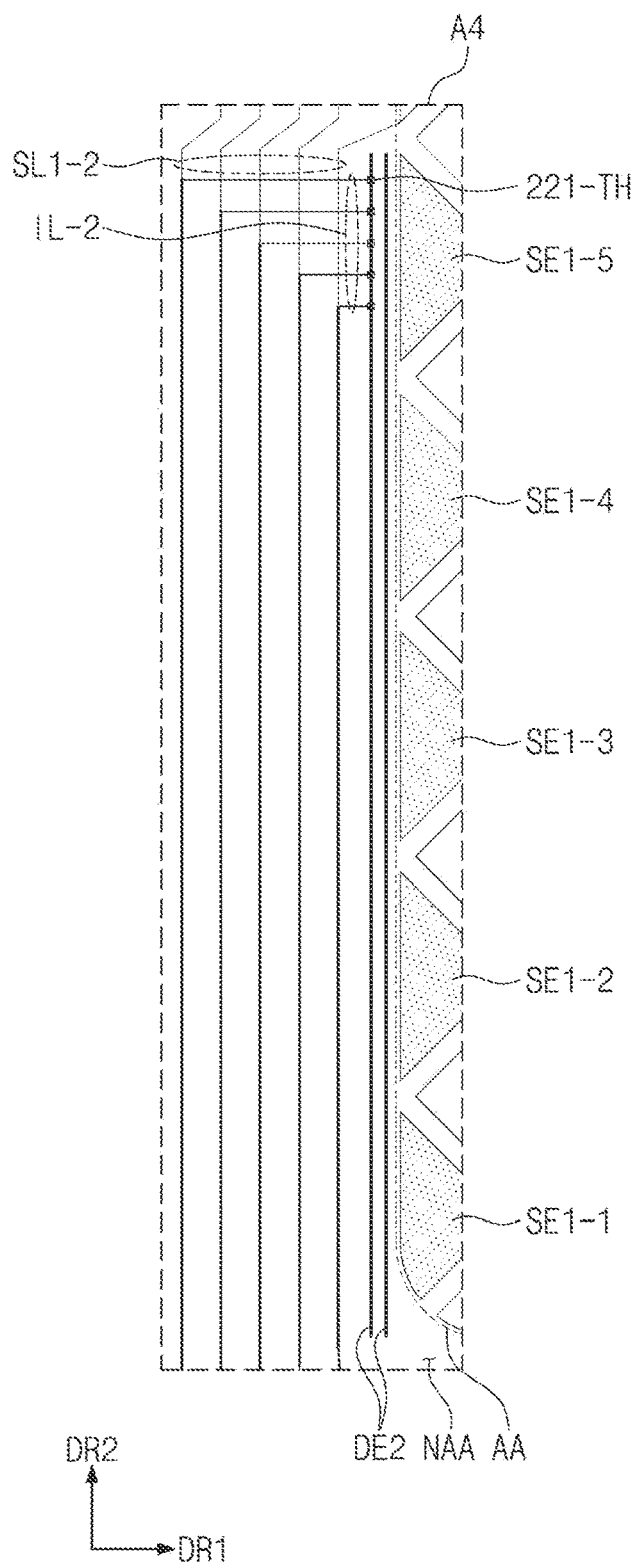
FIG. 7 is a plan view showing a fourth area of FIG. 3.

FIG. 6A is a plan view showing a third area A3 of FIG. 3, FIG. 6B is a cross-sectional view taken along the line V-V' of FIG. 6A, FIG. 6C is a cross-sectional view taken along the line VI-VI' of FIG. 6A, and FIG. 7 is a plan view showing a fourth area A4 of FIG. 3.

The line portion 10 and the pad portion 20 of the first-group signal line SL1-1 may be provided integrally with each other. The line portion 10 and the pad portion 20 of the first inspection line IL-1 may be provided integrally with each other. The line portion 10 and the pad portion 20, which have different widths from each other in the first direction DR1, are shown in FIG. 6A as one example. According to other embodiments, and different from FIG. 6A, the line portion 10 and the pad portion 20 may have the same width as each other.

Referring to FIGS. 6B and 6C, the pad portion 20 of the first-group signal line SL1-1, and the pad portion 20 of the first inspection line IL-1, may be located on different layers from each other. The pad portion 20 of the first-group signal line SL1-1 may be formed through the same process as, and may include the same material as, the first portion B1 and the third portion B3 of the bridge pattern BP2-1 (refer to FIG. 4B). The pad portion 20 of the first inspection line IL-1 may be formed through the same process as, and may include the same material as, the first intermediate portion BP1 of the first sensing portions SP1 (refer to FIG. 4B).

As shown in FIG. 6B, the input sensor 220 may further include a pad electrode PE. The pad electrode PE may be located on the first insulating layer 221, and may be connected to the pad portion 20 via the through hole 221-TH defined through the first insulating layer 221. The second insulating layer 222 may be provided with a contact hole CNT through which at least the pad electrode PE is exposed. At least the pad electrode PE may be electrically connected to a pad of the circuit substrate CF (refer to FIG. 1B) by an anisotropic conductive film or a solder ball. The pad electrode PE may include the same material as the first sensing electrode SE1. That is, the pad electrode PE may include the same material (e.g., the transparent conductive oxide) as the first sensing portions SP1 (refer to FIG. 4B). In some embodiments, the second-group signal line SL1-2 (refer to FIG. 3) and the second signal lines SL2 (refer to FIG. 3) may have substantially the same shapes as those of the first-group signal line SL1-1 described with reference to FIGS. 6A and 6B when viewed in a plane and/or as a cross-section.

As shown in FIG. 6C, a dummy pad electrode DDP that overlaps the pad portion 20 of the first inspection line IL-1 may be further provided. The dummy pad electrode DDP may support the pad portion 20 of the first inspection line IL-1. Because the shape of the pad portion 20 of the first inspection line IL-1 (e.g., when viewed as a cross-section) is substantially the same as the shape of the pad portion 20 of the first-group signal line SL1-1, a bonding reliability between the circuit substrate CF and the input sensor 220 may be improved. According to other embodiments, the dummy pad electrode DDP may be omitted.

As shown in FIG. 7, the second inspection lines IL-2 may be electrically connected to each other through one dummy electrode DE2. The second inspection lines IL-2 may be connected to the same dummy electrode DE2 via the through hole 221-TH.

Hereinafter, a method of inspecting the display device will be described with reference to FIGS. 3 to 7. It is possible to inspect whether the first-group signal lines SL1-1 are damaged using the first inspection lines IL-1, and to inspect whether the second-group signal lines SL1-2 are damaged using the second inspection lines IL-2. For example, damage on the curved portion CP shown in FIG. 3 may be inspected.

An inspection circuit board, on which a driving IC is mounted, may be connected to the first pad area PDA1 and the second pad area PDA2. A first inspection signal may be applied to one of the first signal lines SL1 and the second signal lines SL2 to inspect an operation of the input sensor 220. The first inspection signal may be a touch sensing signal for a normal operation of the input sensor 220. The driving IC may sequentially apply scan signals (hereinafter, referred to as touch scan signals) to either the first signal lines SL1 or the second signal lines SL2, and may receive a readout of a sensing signal from the others of the first signal lines SL1 or the second signal lines SL2.

A second inspection signal may be applied to the inspection lines IL to inspect defects of the inspection lines IL. When the touch scan signals are applied to the first signal lines SL1, the second inspection signal may be substantially simultaneously applied to the inspection lines IL. The second inspection signal may be a scan signal (hereinafter, referred to as an "inspection scan signal") applied to the inspection lines IL. When the touch scan signals are sequentially applied to the first signal lines SL1, the inspection scan signals may be applied to the inspection lines IL.

The inspection scan signals may be sequentially applied to the first inspection lines IL-1 shown in FIG. 5A. The inspection scan signal may be applied to one inspection line, and the sensing signal may be read from four inspection lines. When the one inspection line is damaged, a resistance value calculated from the sensing signal may be greater than a reference value. The resistance value may be calculated by the driving IC of the inspection circuit substrate. In this way, it is possible to sequentially determine whether the five first inspection lines IL-1 are damaged.

Through this inspection method, it is possible to determine a defect occurring during a process of manufacturing the electronic device EA (refer to FIGS. 1A and 1B), such as a portable terminal, by using the electronic panel 200 (refer to FIGS. 1A and 1B), in addition to a defect occurring immediately after the input sensor 220 is manufactured.

Damage on the first inspection lines IL-1 means that the defect occurs in the manufacturing process of the display device. As shown in FIGS. 3 and 5A, the corner area where the signal lines are concentrated is more likely to be defective. It is possible to determine whether the corner area is defective through the inspection lines IL.

Figure 8:
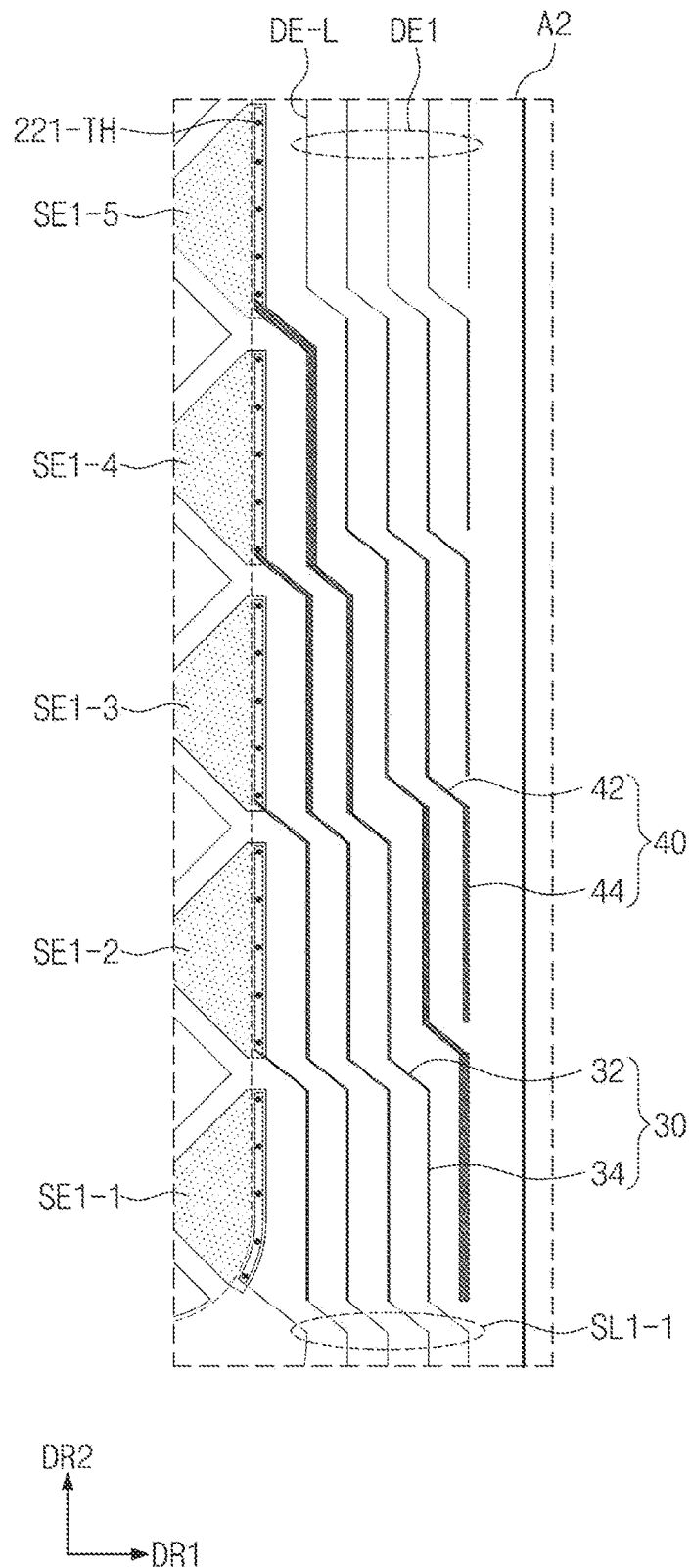
FIGS. 8 and 9 are plan views showing a portion of an input sensor according to some embodiments of the present disclosure.
Figure 9:
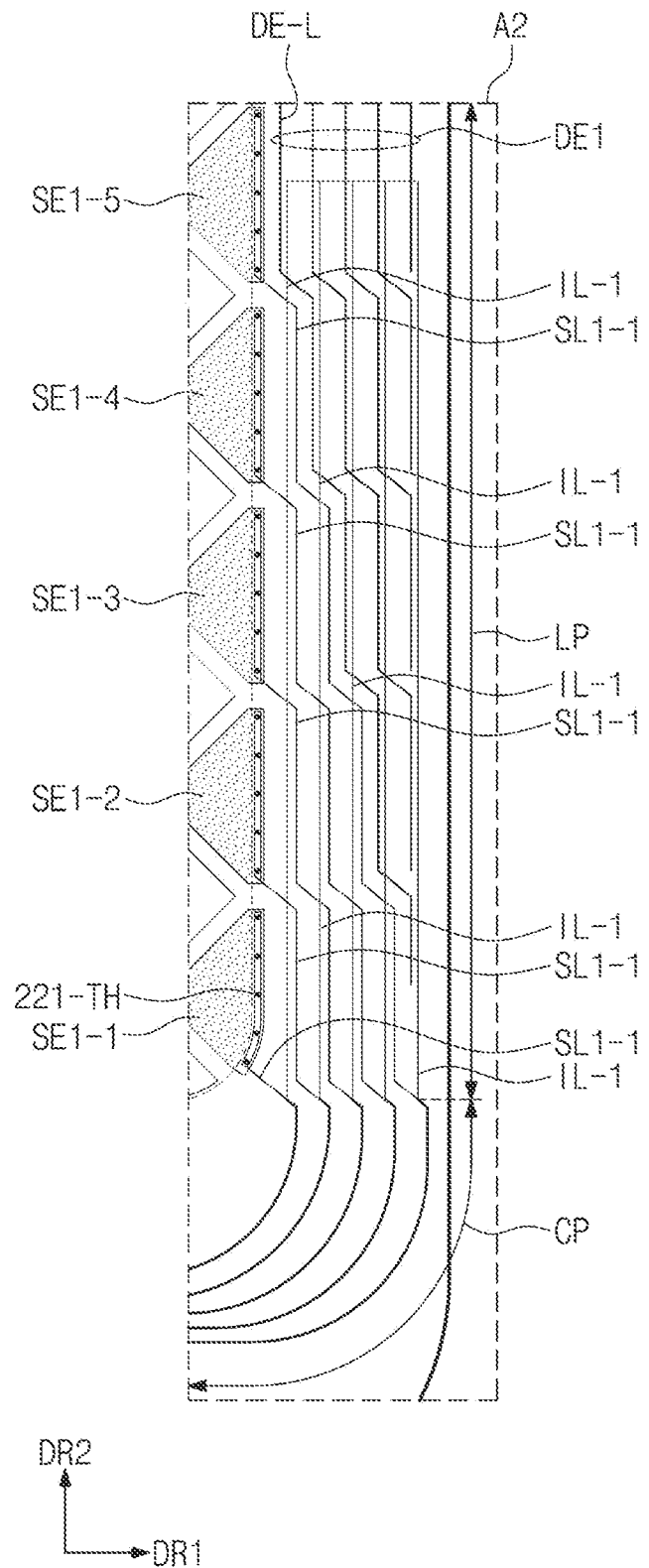
Figure 10:
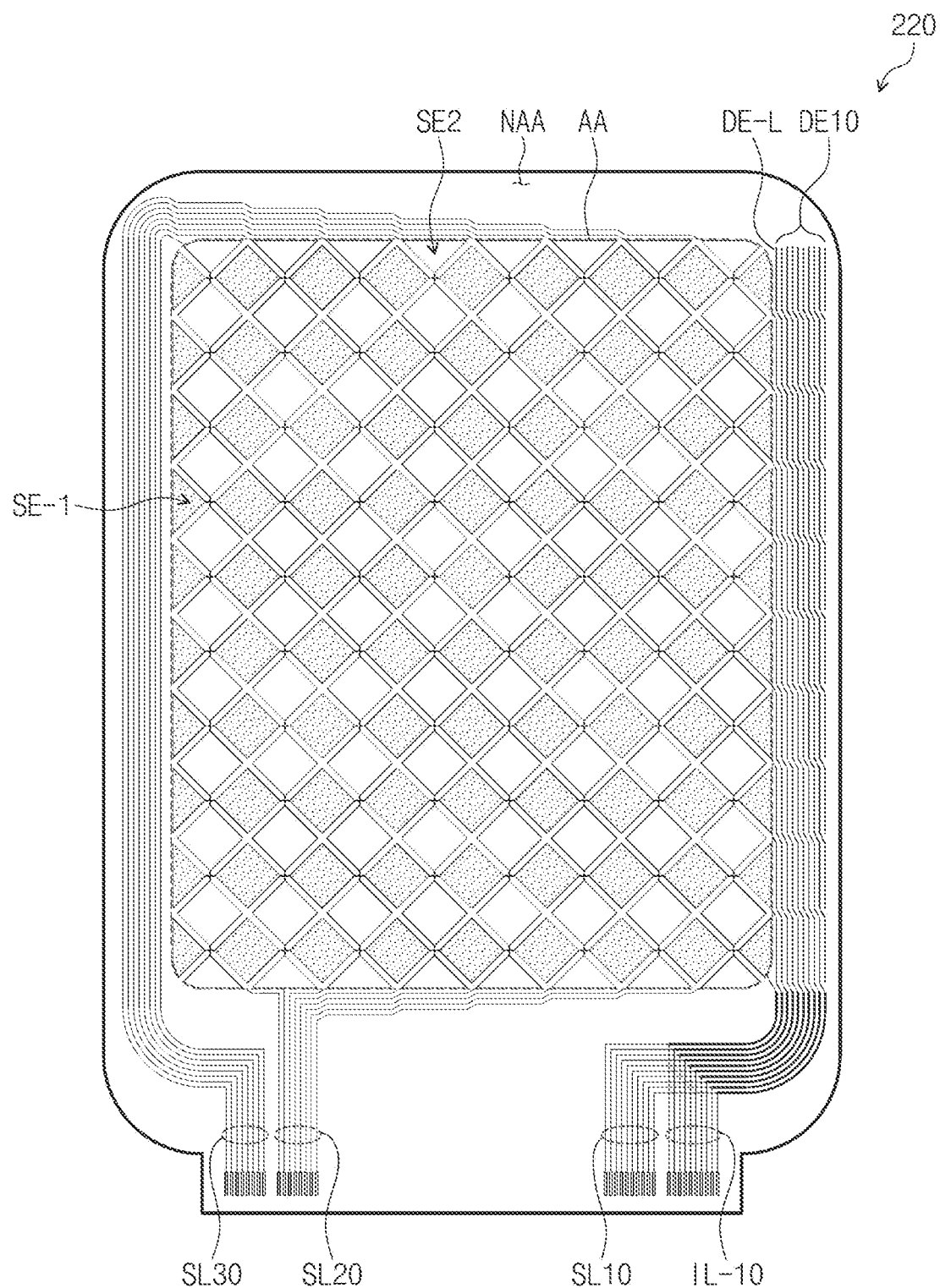
FIG. 10 is a plan view showing an input sensor according to some embodiments of the present disclosure.

FIGS. 8 and 9 are plan views showing a portion of an input sensor 220 according to some embodiments of the present disclosure, and FIG. 10 is a plan view showing an input sensor 220 according to some embodiments of the present disclosure. In FIGS. 8 to 10, repeated detailed descriptions of the same elements as those described with reference to FIGS. 1A to 7 will be omitted.

FIG. 8 is an enlarged view showing the first-group signal lines SL1-1 and the first dummy electrode DE1. The first-group signal lines SL1-1 may include a plurality of unit areas 30 having different widths in the second direction DR2. The first dummy electrode DE1 may include a plurality of unit areas 40 having different widths in the second direction DR2. The unit area 30 may include a straight-line area 34 extending in the second direction DR2 and a diagonal-line area 32 extending from the straight-line area 34, and the unit area 40 may include a straight-line area 44 extending in the second direction DR2 and a diagonal-line area 42 extending from the straight-line area 44.

The unit areas 30 of the first-group signal lines SL1-1 may have the width increasing as a distance from the first pad area PDA1 (refer to FIG. 3) increases. In the first-group signal lines SL1-1, the width of the unit area 30 increases as the signal line is located farther from the first pad area PDA1 to lower the resistance of the signal line having the relatively long length. In contrast, the unit areas 40 of the first dummy electrode DE1 may have the width increasing as a distance from the first pad area PDA1 (refer to FIG. 3) decreases. Because the first dummy electrode DE1 compensates for the area in which the first-group signal lines SL1-1 are not located, a variation in width of the unit area 40 of the first dummy electrode DE1 may be the opposite of a variation in width of the unit area 30 of the first-group signal lines SL1-1. The area having the largest width among the unit areas 40 of the dummy electrode DE-L connected to the first inspection lines IL-1 may be closest to the area having the smallest width among the unit areas 30 of one signal line among the first-group signal lines SL1-1.

As shown in FIG. 9, the first inspection lines IL-1 might not be connected to the first dummy electrode DE1. The first inspection lines IL-1 may have an integral shape, and thus, the first inspection lines IL-1 may be electrically connected to each other. In some embodiments, the first inspection lines IL-1 may have a length that is similar to the length of the longest dummy electrode DE-L. The first inspection lines IL-1 may extend to one end of the longest dummy electrode DE-L that is located farther from the first pad area PDA1 (refer to FIG. 3).

As shown in FIG. 10, the input sensor 220 may include a plurality of first signal lines SL10, a plurality of second signal lines SL20, and a plurality of third signal lines SL30. The second signal lines SL20 may be respectively connected to ends of second sensing electrodes SE2, and the third signal lines SL30 may be respectively connected to other ends of the second sensing electrodes SE2.

The first signal lines SL10 may be respectively connected to ends of first sensing electrodes SE1. The first signal lines SL10 might be located at only one side of an active area AA in the first direction DR1. A plurality of first inspection lines IL-10 may be located to correspond to the first signal lines SL10.

In some embodiments, the first inspection lines IL-10 may be connected to one of dummy electrodes DE10 (e.g., the longest dummy electrode DE-L) due to the structure described with reference to FIGS. 5A to 5C. As described with reference to FIG. 9, as the first inspection lines IL-10 might not be connected to the longest dummy electrode DE-L, and as the first inspection lines IL-10 may have an integral shape, the first inspection lines IL-10 may be electrically connected to each other.

Although some embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present disclosure shall be determined according to the attached claims, with functional equivalents thereof to be included therein.

What is claimed is:

1. A display device comprising:
a base substrate;
sensing electrodes on the base substrate;
signal lines on the base substrate and connected to the sensing electrodes;
an insulating layer on the signal lines;
inspection lines on the insulating layer, each of the inspection lines overlapping a corresponding one of the signal lines and electrically insulated from the corresponding one of the signal lines;
a dummy electrode under the insulating layer, electrically connected to at least one of the inspection lines, and overlapped with at least one of the inspection lines; and
pad electrodes in a pad area, each of the pad electrodes being electrically connected to at least one of the signal lines or the inspection lines,
wherein the dummy electrode comprises a plurality of unit areas having different widths.

2. The display device of claim 1, wherein the base substrate includes an active area in which pixels are overlapped and a peripheral area adjacent to the active area, and
wherein the pad area is in the peripheral area.

3. The display device of claim 2, wherein the pad area comprises a first pad area and a second pad area spaced from the first pad area, and
wherein the pad electrodes comprise first pad electrodes in the first pad area and second pad electrodes in the second pad area.

4. The display device of claim 2, wherein the dummy electrode comprises a first dummy electrode, a second dummy electrode, and a third dummy electrode.

5. The display device of claim 4, wherein at least one of the first dummy electrode, the second dummy electrode, and the third dummy electrode is located between the active area and the signal lines.

6. The display device of claim 4, wherein the pad area comprises a first pad area and a second pad area spaced from the first pad area, and
wherein the pad electrodes include first pad electrodes in the first pad area and second pad electrodes in the second pad area,
wherein the sensing electrodes comprise n first sensing electrodes, "n" being a natural number equal to or greater than 2,
wherein the inspection lines comprise first inspection lines corresponding to first-group signal lines of the signal lines connected to first to i-th first sensing electrodes from among the n first sensing electrodes, "i" being a natural number smaller than "n," and second inspection lines corresponding to second-group signal lines of the signal lines connected to (i+1)th to n-th first sensing electrodes from among the n first sensing electrodes, wherein the first inspection lines and the first-group signal lines are connected to the first pad electrodes and the second inspection lines and second first-group signal lines are connected to the second pad electrodes, and wherein the first dummy electrode is located farther from the first pad area than the first-group signal lines and the third dummy electrode is located farther from the second pad area than the second-group signal lines.

7. The display device of claim 6, wherein the second dummy electrode is located between the active area and the second-group signal lines.

8. The display device of claim 1, wherein the dummy electrode is connected to the inspection lines through contact holes defined in the insulating layer.

9. The display device of claim 1, wherein each of the plurality of unit areas comprise a straight-line area and a diagonal-line area extending from the straight-line area, and wherein the diagonal-line area is extended in a direction crossing an extending direction of the straight-line area.

10. The display device of claim 1, wherein the dummy electrode comprises a metal material, and the inspection lines comprise a transparent conductive oxide.

11. The display device of claim 1, wherein the sensing electrodes comprise first sensing electrodes extending in a first direction, and second sensing electrodes extending in a second direction crossing the first direction, wherein the signal lines comprise first signal lines connected to the first sensing electrodes, and second signal lines connected to the second sensing electrodes, and wherein a first one of the first sensing electrodes and the second sensing electrodes comprise a bridge pattern of which a portion is under the insulating layer, and a sensing pattern on the insulating layer and connected to the bridge pattern.

12. The display device of claim 11, wherein a second one of the first sensing electrodes and the second sensing electrodes are on a same layer as the sensing pattern.

13. The display device of claim 11, wherein the bridge pattern and the dummy electrode comprise a same material, and wherein the sensing pattern and the inspection lines comprise a same material.

14. The display device of claim 1, wherein one of the signal lines has a line width that is smaller than a line width of one of the inspection lines corresponding to the one of the signal lines.

15. A display device comprising:
a base substrate;
sensing electrodes on the base substrate;
signal lines on the base substrate and connected to the sensing electrodes;
an insulating layer on the signal lines;
inspection lines on the insulating layer, each of the inspection lines overlapping a corresponding one of the signal lines and insulated from the corresponding one of the signal lines;
a dummy electrode under the insulating layer, electrically connected to at least one of the inspection lines, and overlapped with at least one of the inspection lines; and
pad electrodes in a pad area, each of the pad electrodes being electrically connected to at least one of the signal lines or the inspection lines,
wherein the dummy electrode comprises a plurality of unit areas having different widths, wherein the base substrate includes an active area in which pixels are overlapped and a peripheral area adjacent to the active area, and the pad area is in the peripheral area, wherein the dummy electrode comprises a first dummy electrode, a second dummy electrode, and a third dummy electrode, wherein the sensing electrodes comprise n first sensing electrodes, "n" being a natural number equal to or greater than 2, wherein the inspection lines comprise first inspection lines corresponding to first-group signal lines of the signal lines connected to first to i-th first sensing electrodes from among the n first sensing electrodes, "i" being a natural number smaller than "n," and second inspection lines corresponding to second-group signal lines of the signal lines connected to (i+1)th to n-th first sensing electrodes from among the n first sensing electrodes, wherein the at least one of the first-group signal lines of the signal lines comprises a plurality of unit areas having different widths, and wherein widths of the plurality of unit areas of the at least one of the first-group signal lines of the signal lines increase as a distance from the pad area increases.

16. The display device of claim 15, wherein the first dummy electrode is located outside the first-group signal lines of the signal lines, and wherein widths of the plurality of unit areas of the first dummy electrode decrease as a distance from the pad area increases.

17. A display device comprising:
a base substrate;
sensing electrodes on the base substrate;
signal lines on the base substrate and connected to the sensing electrodes;
an insulating layer on the signal lines;
inspection lines on the insulating layer, each of the inspection lines overlapping a corresponding one of the signal lines and electrically insulated from the corresponding one of the signal lines;
a dummy electrode under the insulating layer, electrically connected to at least one of the inspection lines, and overlapped with at least one of the inspection lines; and
pad electrodes in a pad area, each of the pad electrodes being electrically connected to at least one of the signal lines or the inspection lines,
wherein the dummy electrode comprises a plurality of unit areas having different widths,
wherein the sensing electrodes comprise first sensing electrodes extending in a first direction, and second sensing electrodes extending in a second direction crossing the first direction,
wherein the signal lines comprise first signal lines connected to the first sensing electrodes, and second signal lines connected to the second sensing electrodes,
wherein a first one of the first sensing electrodes and the second sensing electrodes comprise a bridge pattern of which a portion is under the insulating layer, and a sensing pattern on the insulating layer and connected to the bridge pattern,
wherein the first sensing electrodes comprise n first sensing electrodes, "n" being a natural number equal to or greater than 2,
wherein the inspection lines comprise first inspection lines corresponding to first-group signal lines connected to first to i-th first sensing electrodes from among the n first sensing electrodes, "i" being a natural number smaller than "n," and second inspection lines corresponding to second-group signal lines connected to (i+1)th to n-th first sensing electrodes from among the n first sensing electrodes, wherein the dummy electrode comprises first dummy electrodes and second dummy electrodes, wherein the first inspection lines are connected to one of the first dummy electrodes, and wherein the second inspection lines are connected to one of the second dummy electrodes.

18. The display device of claim 17, wherein the base substrate includes an active area in which pixels are overlapped and a peripheral area adjacent to the active area, and wherein the first-group signal lines, the second-group signal lines, the first dummy electrodes, and the second dummy electrodes are in the peripheral area, wherein the first-group signal lines and the first dummy electrodes are at one side of the active area in the first direction, and wherein the second-group signal lines and the second dummy electrodes are at the other side of the active area in the first direction.

19. The display device of claim 18, wherein one of the second dummy electrodes to which the second inspection lines are connected is between the second-group signal lines and the active area in the first direction.

* * * * *